(12) United States Patent
Shappir et al.

(10) Patent No.: US 7,369,440 B2
(45) Date of Patent: May 6, 2008

(54) METHOD, CIRCUIT AND SYSTEMS FOR ERASING ONE OR MORE NON-VOLATILE MEMORY CELLS

(75) Inventors: Assaf Shappir, Kiryat Ono (IL); Shai Eisen, Tel Aviv (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 11/335,318

(22) Filed: Jan. 19, 2006

(65) Prior Publication Data
US 2006/0158938 A1    Jul. 20, 2006

Related U.S. Application Data

(60) Provisional application No. 60/644,569, filed on Jan. 19, 2005.

(51) Int. Cl.
*G11C 16/04*    (2006.01)

(52) U.S. Cl. .............................. 365/185.19; 365/185.11; 365/185.24; 365/185.29

(58) Field of Classification Search ............ 365/185.11, 365/185.19, 185.29, 185.24
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |

(Continued)

FOREIGN PATENT DOCUMENTS

EP        0 656 628        6/1995

(Continued)

OTHER PUBLICATIONS

U.S. Appl. No. 08/902,890, filed Jul. 30, 1997, Eitan.

(Continued)

*Primary Examiner*—Hoai V. Ho
(74) *Attorney, Agent, or Firm*—EMPK & Shiloh, LLP (57) ABSTRACT

The present invention is a method, circuit and system for erasing one or more non-volatile memory ("NVM") cells in an NVM array or array segment. According to some embodiments of the present invention, one or more erase pulse parameters may be associated with each of a number of array segments within an NVM array. Separate erase pulse parameters may be associated with anywhere from one to all of the array segments within an NVM array. According to some embodiments of the present invention, a characteristic of an erase pulse (e.g. pulse amplitude, pulse duration, etc.) applied to one or more NVM cells within an array segment may be at least partially based on one or more erase pulse parameters associated with the given array segment.

8 Claims, 5 Drawing Sheets

U.S. PATENT DOCUMENTS

| | | |
|---|---|---|
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk et al. |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,369,615 A | 11/1994 | Harari et al. |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,619,452 A * | 4/1997 | Miyauchi ............... 365/185.29 |
| 5,623,438 A | 4/1997 | Guritz et al. |
| 5,627,790 A | 5/1997 | Golla et al. |

| | | | | | | |
|---|---|---|---|---|---|---|
| 5,633,603 A | 5/1997 | Lee | | 5,903,031 A | 5/1999 | Yamada et al. |
| 5,636,288 A | 6/1997 | Bonneville et al. | | 5,910,924 A | 6/1999 | Tanaka et al. |
| 5,644,531 A | 7/1997 | Kuo et al. | | 5,920,503 A | 7/1999 | Lee et al. |
| 5,650,959 A | 7/1997 | Hayashi et al. | | 5,920,507 A | 7/1999 | Takeuchi et al. |
| 5,654,568 A | 8/1997 | Nakao | | 5,926,409 A | 7/1999 | Engh et al. |
| 5,656,513 A | 8/1997 | Wang et al. | | 5,930,195 A | 7/1999 | Komatsu et al. |
| 5,657,332 A | 8/1997 | Auclair et al. | | 5,933,366 A | 8/1999 | Yoshikawa |
| 5,661,060 A | 8/1997 | Gill et al. | | 5,933,367 A | 8/1999 | Matsuo et al. |
| 5,663,907 A | 9/1997 | Frayer et al. | | 5,936,888 A | 8/1999 | Sugawara |
| 5,666,365 A | 9/1997 | Kostreski | | 5,940,332 A | 8/1999 | Artieri |
| 5,672,959 A | 9/1997 | Der | | 5,946,258 A | 8/1999 | Evertt et al. |
| 5,675,280 A | 10/1997 | Nomura | | 5,946,558 A | 8/1999 | Hsu |
| 5,677,867 A | 10/1997 | Hazani | | 5,949,714 A | 9/1999 | Hemink et al. |
| 5,677,869 A | 10/1997 | Fazio et al. | | 5,949,728 A | 9/1999 | Liu et al. |
| 5,683,925 A | 11/1997 | Irani et al. | | 5,959,311 A | 9/1999 | Shih et al. |
| 5,689,459 A | 11/1997 | Chang et al. | | 5,963,412 A | 10/1999 | En |
| 5,694,356 A | 12/1997 | Wong et al. | | 5,963,465 A | 10/1999 | Eitan |
| 5,696,929 A | 12/1997 | Hasbun et al. | | 5,966,603 A | 10/1999 | Eitan |
| 5,708,608 A | 1/1998 | Park et al. | | 5,969,989 A | 10/1999 | Iwahashi |
| 5,712,814 A | 1/1998 | Fratin et al. | | 5,969,993 A | 10/1999 | Takeshima |
| 5,712,815 A | 1/1998 | Bill et al. | | 5,973,373 A | 10/1999 | Krautschneider et al. |
| 5,715,193 A | 2/1998 | Norman | | 5,982,666 A | 11/1999 | Campardo |
| 5,717,581 A | 2/1998 | Canclini | | 5,986,940 A | 11/1999 | Atsumi et al. |
| 5,717,632 A | 2/1998 | Richart et al. | | 5,990,526 A | 11/1999 | Bez et al. |
| 5,717,635 A | 2/1998 | Akatsu | | 5,991,202 A | 11/1999 | Derhacobian et al. |
| 5,721,781 A | 2/1998 | Deo et al. | | 5,991,517 A | 11/1999 | Harari et al. |
| 5,726,946 A | 3/1998 | Yamagata et al. | | 5,999,444 A | 12/1999 | Fujiwara et al. |
| 5,748,534 A | 5/1998 | Dunlap et al. | | 5,999,494 A | 12/1999 | Holzrichter |
| 5,751,037 A | 5/1998 | Aozasa et al. | | 6,000,006 A | 12/1999 | Bruce et al. |
| 5,751,637 A | 5/1998 | Chen et al. | | 6,005,423 A | 12/1999 | Schultz |
| 5,754,475 A | 5/1998 | Bill et al. | | 6,011,725 A | 1/2000 | Eitan |
| 5,760,445 A | 6/1998 | Diaz | | 6,018,186 A | 1/2000 | Hsu |
| 5,760,634 A | 6/1998 | Fu | | 6,020,241 A | 2/2000 | You et al. |
| 5,768,192 A | 6/1998 | Eitan | | 6,028,324 A | 2/2000 | Su et al. |
| 5,768,193 A | 6/1998 | Lee et al. | | 6,030,871 A | 2/2000 | Eitan |
| 5,771,197 A | 6/1998 | Kim | | 6,034,403 A | 3/2000 | Wu |
| 5,774,395 A | 6/1998 | Richart et al. | | 6,034,896 A | 3/2000 | Ranaweera et al. |
| 5,777,919 A | 7/1998 | Chi-Yung et al. | | 6,037,627 A | 3/2000 | Kitamura et al. |
| 5,781,476 A | 7/1998 | Seki et al. | | 6,040,610 A | 3/2000 | Noguchi et al. |
| 5,781,478 A | 7/1998 | Takeuchi et al. | | 6,044,019 A | 3/2000 | Cernea et al. |
| 5,783,934 A | 7/1998 | Tran | | 6,044,022 A | 3/2000 | Nachumovsky |
| 5,784,314 A | 7/1998 | Sali et al. | | 6,063,666 A | 5/2000 | Chang et al. |
| 5,787,036 A | 7/1998 | Okazawa | | 6,064,226 A | 5/2000 | Earl |
| 5,793,079 A | 8/1998 | Georgescu et al. | | 6,064,251 A | 5/2000 | Park |
| 5,801,076 A | 9/1998 | Ghneim et al. | | 6,064,591 A | 5/2000 | Takeuchi et al. |
| 5,805,500 A | 9/1998 | Campardo et al. | | 6,074,916 A | 6/2000 | Cappelletti |
| 5,808,506 A | 9/1998 | Tran | | 6,075,402 A | 6/2000 | Ghilardelli |
| 5,812,449 A | 9/1998 | Song | | 6,075,724 A | 6/2000 | Li et al. |
| 5,812,456 A | 9/1998 | Hull et al. | | 6,078,518 A | 6/2000 | Chevallier |
| 5,812,457 A | 9/1998 | Arase | | 6,081,456 A | 6/2000 | Dadashev |
| 5,815,435 A | 9/1998 | Van Tran | | 6,084,794 A | 7/2000 | Lu et al. |
| 5,822,256 A | 10/1998 | Bauer et al. | | 6,091,640 A | 7/2000 | Kawahara et al. |
| 5,825,683 A | 10/1998 | Chang et al. | | 6,094,095 A | 7/2000 | Murray et al. |
| 5,825,686 A | 10/1998 | Schmitt-Landsiedel et al. | | 6,097,639 A | 8/2000 | Choi et al. |
| 5,828,601 A | 10/1998 | Hollmer et al. | | 6,107,862 A | 8/2000 | Mukainakano et al. |
| 5,834,851 A | 11/1998 | Ikeda et al. | | 6,108,240 A | 8/2000 | Lavi et al. |
| 5,835,935 A | 11/1998 | Estakhri et al. | | 6,108,241 A | 8/2000 | Chevallier |
| 5,836,772 A | 11/1998 | Chang et al. | | 6,117,714 A | 9/2000 | Beatty |
| 5,841,700 A | 11/1998 | Chang | | 6,118,207 A | 9/2000 | Ormerod et al. |
| 5,847,441 A | 12/1998 | Cutter et al. | | 6,118,692 A | 9/2000 | Banks |
| 5,861,771 A | 1/1999 | Matsuda et al. | | 6,122,198 A | 9/2000 | Haddad et al. |
| 5,862,076 A | 1/1999 | Eitan | | 6,128,226 A | 10/2000 | Eitan et al. |
| 5,864,164 A | 1/1999 | Wen | | 6,128,227 A | 10/2000 | Kim |
| 5,867,429 A | 2/1999 | Chen et al. | | 6,130,452 A | 10/2000 | Lu et al. |
| 5,870,334 A | 2/1999 | Hemink et al. | | 6,130,572 A | 10/2000 | Ghilardelli et al. |
| 5,870,335 A | 2/1999 | Khan et al. | | 6,130,574 A | 10/2000 | Bloch et al. |
| 5,872,848 A | 2/1999 | Romney et al. | | 6,133,095 A | 10/2000 | Eitan et al. |
| 5,875,128 A | 2/1999 | Ishizuka et al. | | 6,134,156 A | 10/2000 | Eitan |
| 5,877,537 A | 3/1999 | Aoki | | 6,137,718 A | 10/2000 | Reisinger |
| 5,880,620 A | 3/1999 | Gitlin et al. | | 6,147,904 A | 11/2000 | Liron |
| 5,886,927 A | 3/1999 | Takeuchi | | 6,147,906 A | 11/2000 | Bill et al. |
| RE36,179 E | 4/1999 | Shimoda | | 6,148,435 A | 11/2000 | Bettman |
| 5,892,710 A | 4/1999 | Fazio et al. | | 6,150,800 A | 11/2000 | Kinoshita et al. |

| | | |
|---|---|---|
| 6,154,081 A | 11/2000 | Pakkala et al. |
| 6,156,149 A | 12/2000 | Cheung et al. |
| 6,157,242 A | 12/2000 | Fukui |
| 6,157,570 A | 12/2000 | Nachumovsky |
| 6,163,048 A | 12/2000 | Hirose et al. |
| 6,163,484 A | 12/2000 | Uekubo |
| 6,169,691 B1 | 1/2001 | Pasotti et al. |
| 6,175,519 B1 | 1/2001 | Lu et al. |
| 6,175,523 B1 | 1/2001 | Yang et al. |
| 6,181,597 B1 | 1/2001 | Nachumovsky |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,190,966 B1 | 2/2001 | Ngo et al. |
| 6,192,445 B1 | 2/2001 | Rezvani |
| 6,195,196 B1 | 2/2001 | Kimura et al. |
| 6,198,342 B1 | 3/2001 | Kawai |
| 6,201,282 B1 | 3/2001 | Eitan |
| 6,201,737 B1 | 3/2001 | Hollmer et al. |
| 6,205,055 B1 | 3/2001 | Parker |
| 6,205,056 B1 | 3/2001 | Pan et al. |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,308,485 B1 | 10/2001 | Blumenthal |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,335,990 B1 | 1/2002 | Chen et al. |
| 6,337,502 B1 | 1/2002 | Eitan et al. |
| 6,339,556 B1 | 1/2002 | Watanabe |
| 6,343,033 B1 | 1/2002 | Parker |
| 6,344,959 B1 | 2/2002 | Milazzo |
| 6,346,442 B1 | 2/2002 | Aloni et al. |
| 6,348,381 B1 | 2/2002 | Jong et al. |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,062 B1 | 3/2002 | Elmhurst et al. |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnickle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,448,750 B1 | 9/2002 | Shor et al. |
| 6,449,188 B1 | 9/2002 | Fastow |
| 6,449,190 B1 | 9/2002 | Bill |
| 6,452,438 B1 | 9/2002 | Li |
| 6,455,896 B1 | 9/2002 | Chou et al. |
| 6,456,528 B1 | 9/2002 | Chen |
| 6,456,533 B1 | 9/2002 | Hamilton et al. |
| 6,456,539 B1 | 9/2002 | Nguyen et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,084 B1 | 11/2002 | Eitan |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Park et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |

| | | |
|---|---|---|
| 6,583,007 B1 | 6/2003 | Eitan |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,690 B2 * | 9/2003 | Roohparvar ........... 365/185.22 |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,541 B2 | 7/2005 | Shimbayashi et al. |
| 6,917,544 B2 | 7/2005 | Maayan et al. |
| 6,928,001 B2 | 8/2005 | Avni et al. |
| 6,930,928 B2 | 8/2005 | Liu et al. |
| 6,937,523 B2 | 8/2005 | Eshel |
| 6,954,393 B2 | 10/2005 | Lusky et al. |
| 6,967,872 B2 | 11/2005 | Quader et al. |
| 6,967,896 B2 | 11/2005 | Eisen et al. |
| 6,977,410 B2 * | 12/2005 | Naso et al. .................. 257/316 |
| 6,981,188 B2 * | 12/2005 | Galzur et al. ................ 714/719 |
| 6,996,692 B2 | 2/2006 | Kuono |
| 7,043,672 B2 | 5/2006 | Merritt |
| 7,079,420 B2 | 7/2006 | Shappir et al. |
| 7,116,577 B2 | 10/2006 | Eitan |
| 2001/0006477 A1 | 7/2001 | Banks |
| 2002/0004878 A1 | 1/2002 | Norman |
| 2002/0004921 A1 | 1/2002 | Muranaka et al |
| 2002/0064911 A1 | 5/2002 | Eitan |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0214852 A1 | 11/2003 | Chang |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0017717 A1 | 1/2004 | Morishima |
| 2004/0021172 A1 | 2/2004 | Zheng et al. |
| 2004/0027858 A1 | 2/2004 | Takahashi et al. |
| 2004/0117395 A1 | 6/2004 | Gong et al. |
| 2004/0136236 A1 | 7/2004 | Cohen |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0058005 A1 | 3/2005 | Shappir et al. |
| 2005/0078026 A1 | 4/2005 | Cai |
| 2005/0117395 A1 | 6/2005 | Maayan et al. |
| 2005/0117601 A1 | 6/2005 | Anderson et al. |
| 2005/0140405 A1 | 6/2005 | Do et al. |
| 2005/0213593 A1 | 9/2005 | Anderson et al. |
| 2005/0232024 A1 | 10/2005 | Atir et al. |
| 2006/0015691 A1 * | 1/2006 | Louie et al. .................. 711/154 |
| 2006/0084219 A1 | 4/2006 | Lusky et al. |
| 2006/0126382 A1 | 6/2006 | Maayan et al. |

| | | |
|---|---|---|
| 2006/0126983 | A1 | 6/2006 Shappir et al. |

| | | |
|---|---|---|
| WO | WO 03/100790 | 12/2003 |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | 1 091 418 | 4/2001 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |

OTHER PUBLICATIONS

U.S. Appl. No. 11/489,327, filed Jul. 18, 2006, Eitan et al.
U.S. Appl. No. 11/440,624, filed May 24, 2006, Lusky et al.
U.S. Appl. No. 11/489,747, filed Jul. 18, 2006, Bloom et al.
U.S. Appl. No. 11/336,093, filed Jan. 20, 2006, Eitan et al.
Bude et al., EEPROM/Flash Sub 3.0V drain—Source Bias Hot Carrier Writing, IEDM, 1995, pp. 989-992.
Bude et al., Secondary Electron Flash—a High Performance. Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verfied Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Voc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implantation in Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35 No. 4B.
Umezawa, et al., A 5-V-Only Operation 0.6-μm Flash EEPROM with Row Decoder Scheme in Triple-Well Structure, IEEE Journal of Solid-State Circuits, 1992, 1540, vol. 27.
Mitchell, et al., A new self-aligned planar array cell for ultra high density EPROMS, 1987.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Saifun Non-Volatile Memory Technology", 1st Edition, 2005, published and written by Saifun Semiconductors Ltd. 1110 pgs.

Esquivel, et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059: Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; no web site allowed.

* cited by examiner

METHOD, CIRCUIT AND SYSTEMS FOR ERASING ONE OR MORE NON-VOLATILE MEMORY CELLS

RELATED APPLICATIONS

This application asserts priority of U.S. provisional patent application Ser. No. 60/644,569 filed Jan. 19, 2005.

FIELD OF THE INVENTION

The present invention generally relates to the field of non-volatile memory ("NVM") cells. More specifically, the present invention relates to a method, circuit and system for erasing one or more NVM cells using one or more stored erase parameters

BACKGROUND OF THE INVENTION

Figure 2A:
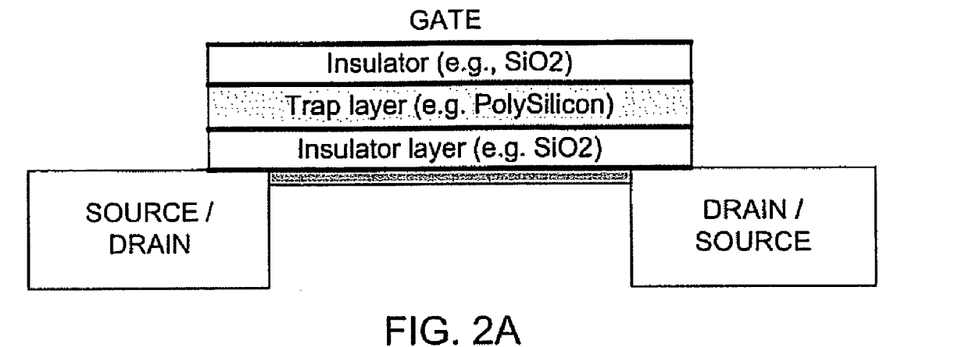
FIG. 2A shows a block diagram depicting a side cross sectional view of a floating gate memory cell.
Figure 2B:
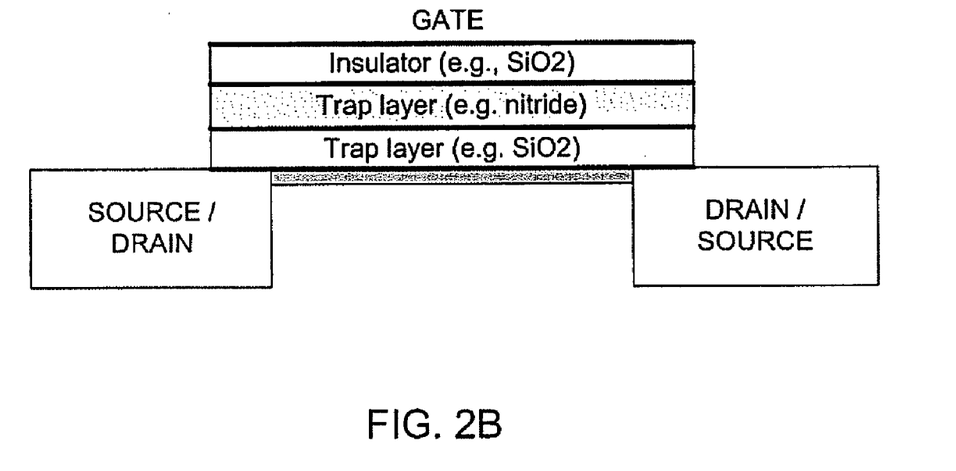
FIG. 2B shows a block diagram depicting a side cross sectional view of a Nitride Read Only Memory ("NROM") cell having to distinct programming charge storage regions.

Non-volatile memory ("NVM") devices are fabricated in a large variety of structures, including but not limited to polysilicon floating gate, as shown in FIG. 2A, and Nitride Read Only Memory ("NROM"), as shown in FIG. 2B. Floating gate devices usually include a conducting charge trapping layer (e.g., composed of polysilicon), as shown in FIG. 2A, and thus usually provide only one charge storage region NROM devices, on the other had, may include a dielectric charge storage layer (e.g. composed of silicon oxide), as shown in FIG. 2B, and thus may support multiple charge storage regions (e.g. one near the cell's source junction and one near the cells drain junction). Each charge storage region of an NVM device may be considered to be a separate NVM cell or unit.

For purposes of producing mass data storage devices (e.g. Flash Memory Cards/Sticks, Multimedia Card, etc.), NVM cells are usually organized into and fabricated as part of a large matrix of cells referred to as an array. Depending upon which one of the many known array architectures and operating methodologies is used, each cell in an array may be addressable, programmable, readable and/or erasable either individually or as part of a group/block of cells. Most cell array architectures, including virtual ground arrays, which are well known in the field, include the feature of a multiplicity of repeating segments formed into rows and columns. According to some exemplary array architectures, such as a virtual ground array, each array segment may include a cell area formed of four segmented cell bit lines, an even select area, and an odd select area. The even select area may be located at one end of the cell area and may include a segmented even contact bit line and two select transistors connecting the even contact bit line with the even cell bit lines of the segment. The odd select area may be located at the opposite end of the cell area and may include a segmented odd contact bit line and two select transistors connecting the odd contact bit line with the odd cell bit lines of the segment. An NVM array may additionally include one even contact connected to the even contact bit lines of two neighboring even select areas, one odd contact connected to the odd contact bit lines of two neighboring odd select areas and alternating even and odd metal lines connecting to the even and odd contacts, respectively As is well known, an NVM cell's logical state may be defined and determined by its threshold voltage ("Vt"), the gate to source/drain voltage at which the cell begins to significantly conduct current. Each cell or charge storage region of a multi-charge storage region NVM device may be associated with a difference threshold voltage and thus may store a unique logical value. Each cell or each charge storage region may be operated (i.e. programmed, erased or read) from a separate terminal or set of terminals of its respective device. The operation of multi-charge storage region NVM devices is well known in the art. The preceding and proceeding discussion relating to the operation of an NVM cell may apply either to the operation of a single charge storage region of a single charge storage region device or to the operation of each charge storage region of a multi-charge storage region device.

Figure 1A:
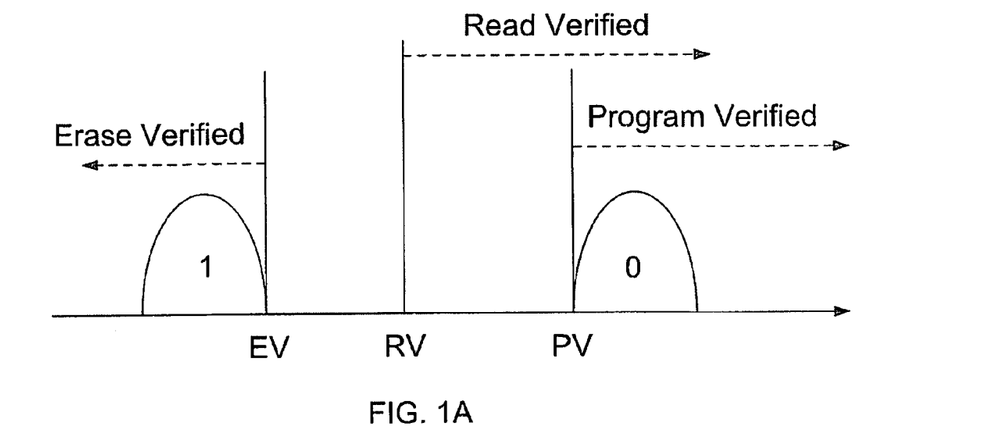
FIG. 1A shows a voltage distribution graph depicting possible threshold voltage distributions in the charge storage region of a binary non-volatile memory cell, wherein vertical lines depict boundary values or voltage threshold level correlated with the Program Verify, Read Verify and Intermediate Program Verify levels for each of the cell's possible program states.
Figure 1B:
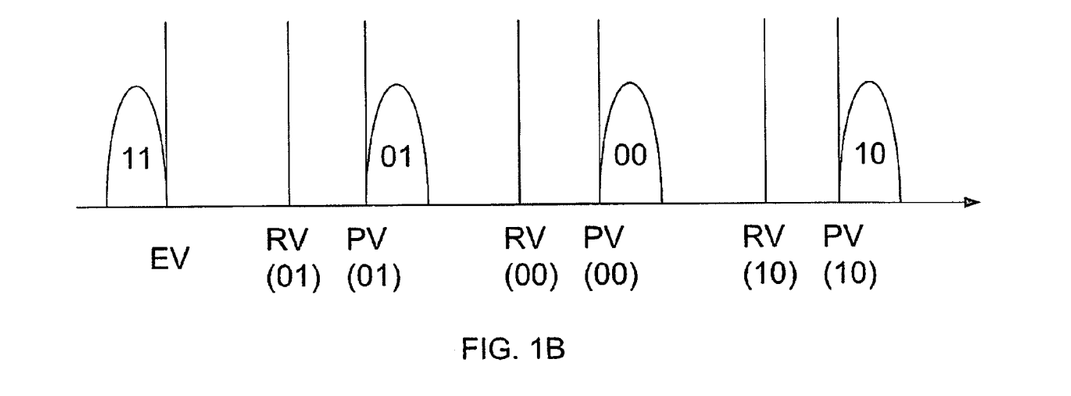
FIG. 1B shows a voltage distribution graph depicting possible threshold voltage distributions in the charge storage region of a multi-level non-volatile memory cell ("MLC"), wherein sets of vertical lines depict boundary values or voltage threshold levels correlated with the Program Verify, Read Verify and Intermediate Program Verify levels for each of the cell's possible states.

For each NVM cell, different threshold voltage values are associated with different logical states, and a NVM cell's threshold voltage level may be a function of the amount of charge (e.g electrons or holes) stored in the charge storage region of the cell. FIG. 1A shows a voltage distribution graph depicting possible threshold voltage distributions of a binary non-volatile memory cell, wherein vertical lines depict boundary cell threshold voltage Vt values associated with each of the cell's possible logical states. For example, cells having Vt Lower than EV level may be considered erased verified. Cells having Vt Higher than PV may be considered program verified. These two limits define logical states associated with the completion of programming and erase sequences that may be performed on a cell. A Program sequence of programming pulses may be used to drive the Vt of a cell higher than PV, while an erase sequence may be used to drive the cell's Vt lower than EV. Also visible in FIG. 1A is a vertical line designating a Read Verify (RV) level which is often used during a reading operation. More specifically, if during reading a cell's Vt is above the RV level, the cell is considered programmed, and if the cell's Vt is below RV, the cell is considered not to be programmed FIG. 1B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), and another set of vertical lines depict boundary values correlated with the Read Verify level of each of the cell's possible program states (RV00, RV01, etc.).

Various methods for programming (i.e. injecting charge into the charge storage regions) and/or erasing (i.e. removing charge from a charge storage region) of individual cells within an NVM array are known. For the most part, the amount of charge stored in a charge storage region of an NVM cell may be increased by applying one or more programming pulses to the cell, while conversely, the amount of charge in the charge storage region of a cell may decrease by applying one or more erase pulses to the gate terminal of an NVM cell, thus forcing the release of trapped charges from the cell's trap region and from the cell's trap interfaces. Alternatively, an erase process may include injecting charge of opposite polarity rather than a physical removal of charge. For example, if a programming process includes injecting electrons into a cell's charge traps, a corresponding erase process may include the injection of holes into the traps. The opposite charges may recombine and or cancel the effect of each other.

More specifically, when discussing an erase procedure for one or more NVM cells in an NROM virtual ground array, an erase step may include the application of a strong negative voltage pulse to the gates of one or more cells (e.g. −7V), the application of a positive voltage to the drains of the cells (e.g. +3V to +7V), and allowing the sources of the cell to float. For cell's being erased, the charges stored in their respective trap regions near their drain junctions, slightly over the channel, may be sunk in the drains of the cells being erased (or being recombined with the hole injection).

Groups or sets of cells within an NVM array may be programmed and/or erased concurrently. The group or set of NVM cells may consist of cells being programmed to (or erased from) the same logical state, or may consist of cells being programmed to (or erased from) each of several possible states, such as may be the case with cells in an MLC array. Since not all cells have the same susceptibility to being programmed and/or being erased, cells within a set of cells receiving programming or erasing pulses may not program or erase at the same rate. Some cells may reach a target program state, or an erased state, before other cells in the same set of cells that are receiving programming or erasing pulses concurrently.

Methods used for operating NVM cells (e.g. programming, reading, and erasing) use one or more reference structures such as reference cells to provide reference levels (i.e. PVs, EVs). Each of the one or more reference structures may be compared against a memory cell being operated in order to determine a condition or state of the memory cell being operated. Generally, in order to determine whether an NVM cell is at a specific state, for example erased, programmed, or programmed at one of multiple possible program states within a multi-level cell ("MLC"), the cell's threshold level is compared to that of a reference structure whose threshold level is preset and known to be at a voltage level associated with the specific state being tested for. Comparing the threshold voltage of an NVM cell to that of a reference cell is often accomplished using a sense amplifier. Various techniques for comparing an NVM's threshold voltage against those of one or more reference cells, in order to determine the state(s) of the NVM's cells, are well known.

When programming an NVM cell to a desired state, a reference cell with a threshold voltage set at a voltage level defined as a "program verify" level for the given state may be compared to the threshold voltage of the cell being programmed in order to determine whether a charge storage area or region of the cell being programmed has been sufficiently charged so as to be considered "programmed" at the desired state. If after a programming pulse has been applied to a cell, it has been determined that a cell has not been sufficiently charged in order for its threshold voltage to be at or above a "program verify" level (i.e. the threshold voltage of the relevant reference cell) associated with the target program state, the cell is typically hit with another programming pulse to try to inject more charge into its charge storage region. Once a cell's threshold value reaches or exceeds the "program verify" level to which it is being programmed, no further programming pulses may need to be applied to the cell. The same general principle of operation applies when erasing one or more cells, with the exception that erase pulses, rather than programming pulses, are applied to the cell.

Figure 3:
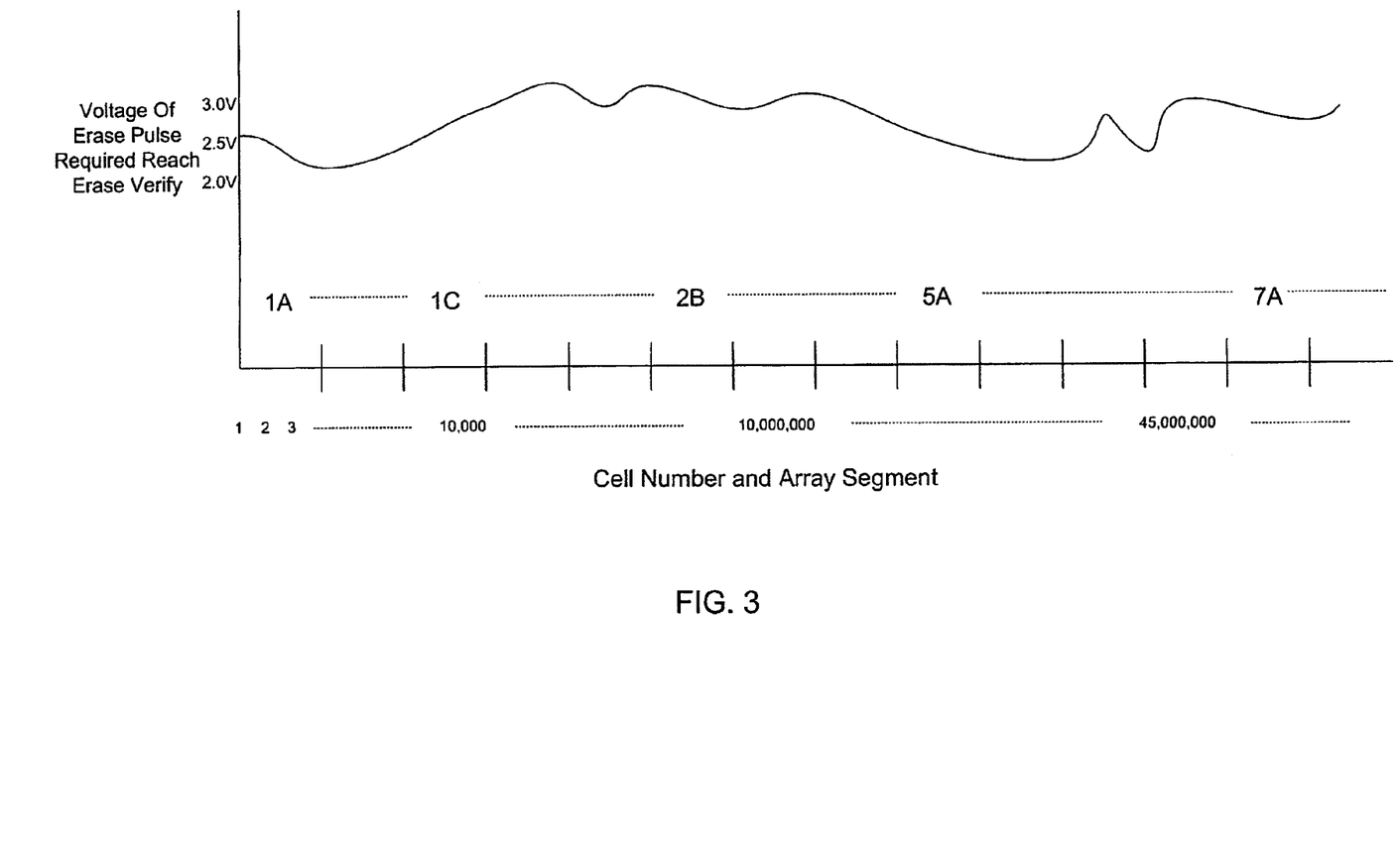
FIG. 3 shows a graph indicating an exemplary distributions of erase pulse voltage values required to induce an erased state in each of a set of NVM cells within each of multiple array segments of an exemplary NVM array such as the one shown in FIG. 4.

Immediately after fabrication, and especially after multiple programming/erase cycles, each NVM cell's susceptibility to programming and erasing is different from that of any other NVM cell and continues to change over the life the of the cell. FIG. 3 shows a graph indicating an exemplary distribution of erase pulse voltage values required to induce an erased state in each of a set of NVM cells within each of multiple array segments of an exemplary NVM array such as the array shown in FIG. 4.

There is a need in the field of NVM production for improved methods, circuits and systems of erasing one or more NVM cells.

SUMMARY OF THE INVENTION

The present invention is a method, circuit and system for erasing one or more non-volatile memory ("NVM") cells in an NVM array or array segment. According to some embodiments of the present invention, one or more erase pulse parameters may be associated with each of a number of array segments within an NVM array. Separate erase pulse parameters may be associated with anywhere from one to all of the array segments within an NVM array.

According to some embodiments of the present invention, at least one characteristic of an erase pulse (e.g. pulse amplitude, pulse duration, etc.) to be applied to one or more NVM cells within an array segment may be at least partially based on one or more erase pulse parameters associated with the given array segment. According to further embodiments of the present invention, the one or more erase pulse parameters associated with a given array segment may be stored during sorting of the NVM array, and according to yet further embodiments of the present invention, the one or more erase pulse parameters associated with a given array segment may be updated after an erase operation has been performed on one or more NVM cells in the array segment.

The one or more erase pulse parameters associated with a given array segment may be correlated to the highest erase pulse voltage required to cause one or more cells in the array segment to reach an erased threshold voltage. According to some embodiments of the present invention, the one or more erase pulse parameters associated with a given array segment may indicate substantially the erase pulse voltage at which a slowest erasing NVM cell in the array segment was induced to reach a threshold voltage associated with an erase state during previous erase operation or cycle. According to further embodiments, the one or more erase pulse parameters may indicate an erase pulse voltage that is offset from, and lower than, the voltage at which a slowest erasing NVM cell in the array segment was induced to reach a threshold voltage associated with an erased state during a previous erase operation/cycle. According to yet further embodiments of the present invention, the one or more erase pulse parameters associated with a given array segment may be correlated to the erase pulse voltage which induced an erase state in an NVM cell other than the slowest erasing cell within the array segment. According to some further embodiments of the present invention, one or more erase pulse parameters associated with a given array segment may be associated with a duration of an erase pulse which induced a relatively slow erasing cell in the array segment to reach an erase state during a previous erase operation/cycle. It should be obvious to one of ordinary skill in the art that an erase pulse parameter may indicate any erase pulse characteristic (e.g. amplitude, duration, slope, shape, etc.) which may have an impact on an erase pulse's effectiveness in causing an NVM cell to reach a threshold voltage associated with an erase state.

According to some embodiments of the present invention, the one or more erase pulse parameters associated with each array segment may be stored on one or more NVM cells within the given array segment to which the erase pulse parameter is related, or on one or more NVM cells otherwise functionally associated with the given array segment. The one or more erase parameters associated with an array segment may be first stored in the relevant NVM cells during sorting. The one or more erase parameters associated with a given array segment may later be updated, either after every erase operation/cycle of the one or more cells within the array segment, or intermittently, after some number of erase operations/cycles of a given array segment. It should be obvious to one of ordinary skill in the art that an erase pulse parameter may be stored on any NVM cell functionally associated with the array segment with which it is associated.

According to some embodiments of the present invention, there is provided one or more NVM cells associated with an NVM array segment and adapted to store one or more erase pulse parameters also associated with the NVM array segment. According to further embodiments of the present invention, there is provided an erase pulse source (e.g., charge pump, controller, etc.) adapted to produce an erase pulse whose characteristic is at least partially based upon one or more erase pulse parameters stored in NVM cells associated with a given array segment, when the source is producing an erase pulse intended for cells within the given array segment.

According to some embodiments of the present invention, there is provided a controller adapted to read one or more erase pulse parameters associated with a given array segment and to signal an erase pulse source to produce one or more erase pulses at least partially based upon the read erase pulse parameters. According to further embodiments of the present invention, a controller may be adapted to record an erase pulse parameter associated with a pulse characteristic (e.g. amplitude, duration, etc.) for an erase pulse which induced an NVM cell to reach a threshold voltage associated with an erase state during an erase operation/cycle. The controller may store the erase pulse parameter in an NVM cell functionally associated with the array segment relevant to the given erase pulse parameter

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods and procedures have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer.

The present invention is a method, circuit and system for erasing one or more non-volatile memory ("NVM") cells in an NVM array or array segment. According to some embodiments of the present invention, one or more erase pulse parameters may be associated with each of a number of array segments within an NVM array. Separate erase pulse parameters may be associated with anywhere from one to all of the array segments within an NVM array.

According to some embodiments of the present invention, at least one characteristic of an erase pulse (e.g. pulse amplitude, pulse duration, etc.) to be applied to one or more NVM cells within an array segment may be at least partially based on one or more erase pulse parameters associated with the given array segment. According to further embodiments of the present invention, the one or more erase pulse parameters associated with a given array segment may be stored during sorting of the NVM array, and according to yet further embodiments of the present invention, the one or more erase pulse parameters associated with a given array segment may be updated after an erase operation has been performed on one or more NVM cells in the array segment.

The one or more erase pulse parameters associated with a given array segment may be correlated to the highest erase pulse voltage required to cause one or more cells in the array segment to reach an erased threshold voltage. According to some embodiments of the present invention, the one or more erase pulse parameters associated with a given array segment may indicate substantially the erase pulse voltage at which a slowest erasing NVM cell in the array segment was induced to reach a threshold voltage associated with an erase state during previous erase operation or cycle. According to further embodiments, the one or more erase pulse parameters may indicate an erase pulse voltage that is offset from, and lower than, the voltage at which a slowest erasing NVM cell in the array segment was induced to reach a threshold voltage associated with an erased state during a previous erase operation/cycle. According to yet further embodiments of the present invention, the one or more erase pulse parameters associated with a given array segment may be correlated to the erase pulse voltage which induced an erase state in an NVM cell other than the slowest erasing cell within the array segment. According to some embodiments of the present invention, the one or more erase pulse parameters associated with a given array segment may be correlated to an erase pulse characteristic (e g. voltage) which induced an erase state in an NVM cell within the array segment which erased the fastest during a previous erase operation/cycle.

According to some further embodiments of the present invention, one or more erase pulse parameters associated with a given array segment may be associated with a duration of an erase pulse which induced a relatively slow erasing cell in the array segment to reach an erase state during a previous erase operation/cycle. It should be obvious to one of ordinary skill in the art that an erase pulse parameter may indicate any erase pulse characteristic (e.g. amplitude, duration, slope, shape, etc.) which may have an impact on an erase pulse's effectiveness in causing an NVM cell to reach a threshold voltage associated with an erase state.

According to some embodiments of the present invention, the one or more erase pulse parameters associated with each array segment may be stored on one or more NVM cells within the given array segment to which the erase pulse parameter is related, or on one or more NVM cells otherwise functionally associated with the given array segment. The one or more erase parameters associated with an array segment may be first stored in the relevant NVM cells during sorting. The one or more erase parameters associated with a given array segment may later be updated, either after every erase operation/cycle of the one or more cells within the array segment, or intermittently, after some number of erase operations/cycles of a given array segment. It should be obvious to one of ordinary skill in the art that an erase pulse parameter may be stored on any NVM cell functionally associated with the array segment with which it is associated.

According to some embodiments of the present invention, there is provided one or more NVM cells associated with an NVM array segment and adapted to store one or more erase pulse parameters also associated with the NVM array segment. According to further embodiments of the present invention, there is provided an erase pulse source (e.g. charge pump, controller, etc.) adapted to produce an erase pulse whose characteristic is at least partially based upon one or more erase pulse parameters stored in NVM cells associated with a given array segment, when the source is producing an erase pulse intended for cells within the given array segment.

According to some embodiments of the present invention, there is provided a controller adapted to read one or more erase pulse parameters associated with a given array segment and to signal an erase pulse source to produce one or more erase pulses at least partially based upon the read erase pulse parameters According to further embodiments of the present invention, a controller may be adapted to record an erase pulse parameter associated with a pulse characteristic (e.g. amplitude, duration, etc.) for an erase pulse which induced an NVM cell to reach a threshold voltage associated with an erase state during an erase operation/cycle. The controller may store the erase pulse parameter in an NVM cell functionally associated with the array segment relevant to the given erase pulse parameter.

Figure 4:
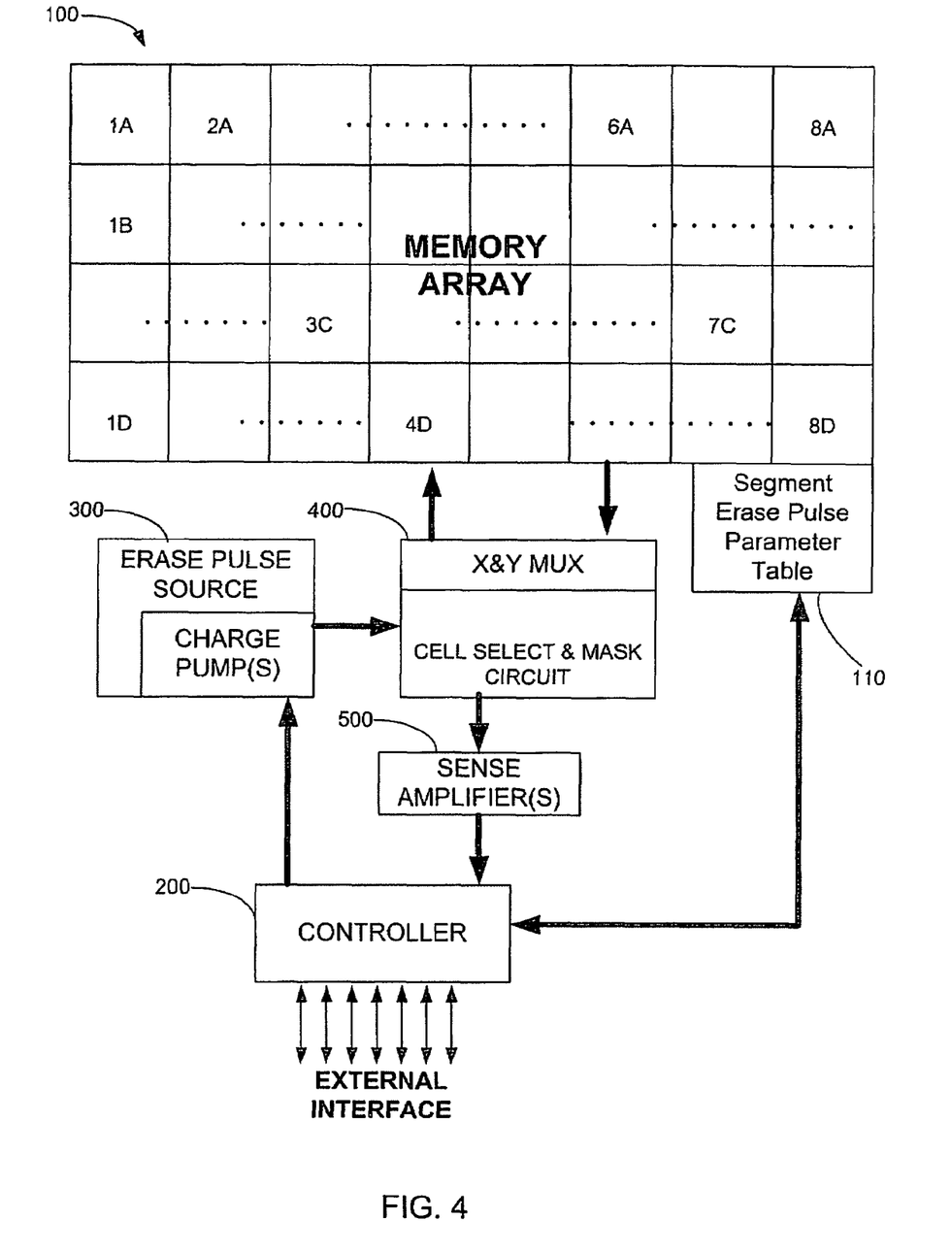
FIG. 4 shows a block diagram of an exemplary NVM circuit and array according to some embodiments of the present invention, wherein a controller may access an erase pulse parameter associated with a given array segment from a table prior to initiating an erase pulse, via an erase pulse source, to the given array segment.

Turning now to FIG. 4, there is shown a block diagram of an exemplary NVM circuit and array 100 according to some embodiments of the present invention, wherein a controller 200 may access an erase pulse parameter associated with a given array segment (e.g. 2A) from a table 110 prior to initiating an erase pulse, via an erase pulse source 300, to the given array segment. Upon either initiating an erase operation or cycle on one or more cells within a given array segment, either due to a signal received via an external interface or based on its own protocols, the controller 200 may look up one or more erase pulse parameters associated with the given array segment in the segment erase pulse parameter table 110.

The one or more erase pulse parameters associated with each array segment may have been initially programmed into the table 110 during sorting of the array 10, and may have been updated after a previous erase operation/cycle of the given array segment. The stored erase parameter associated with each array segment may indicate at least one characteristic (e.g. voltage and/or duration) of an erase pulse which induced an NVM cell in the given array segment to reach an erase state during a previous erase operation/cycle.

The controller 200 may use the one or more erase pulse parameters associated with a given array segment to cause an erase pulse source 300 to produce one or a series of erase pulses at least partially based upon the one or more erase pulse parameters. The produced erase pulses may be applied to the array 100 through X/Y MUX circuit 400, which are commonly known in the field The erase may be applied to all or a subset of the NVM cells in a given array segment.

Once the controller 200 senses through a sense amplifier 500 that at least some portion of the cells in a given array segment which are receiving erase pulses have reached an erase verify level (either the first cell, the last cell, or some cell in between), the controller 200 may update records of the parameter table 110 which are associated with the given array segment with one or more new erase pulse parameter (s) correlated to some characteristic of an erase pulse which induced an NVM cell in the array segment to reach an erase verified state during the present erase operation/cycle.

Figure 5:
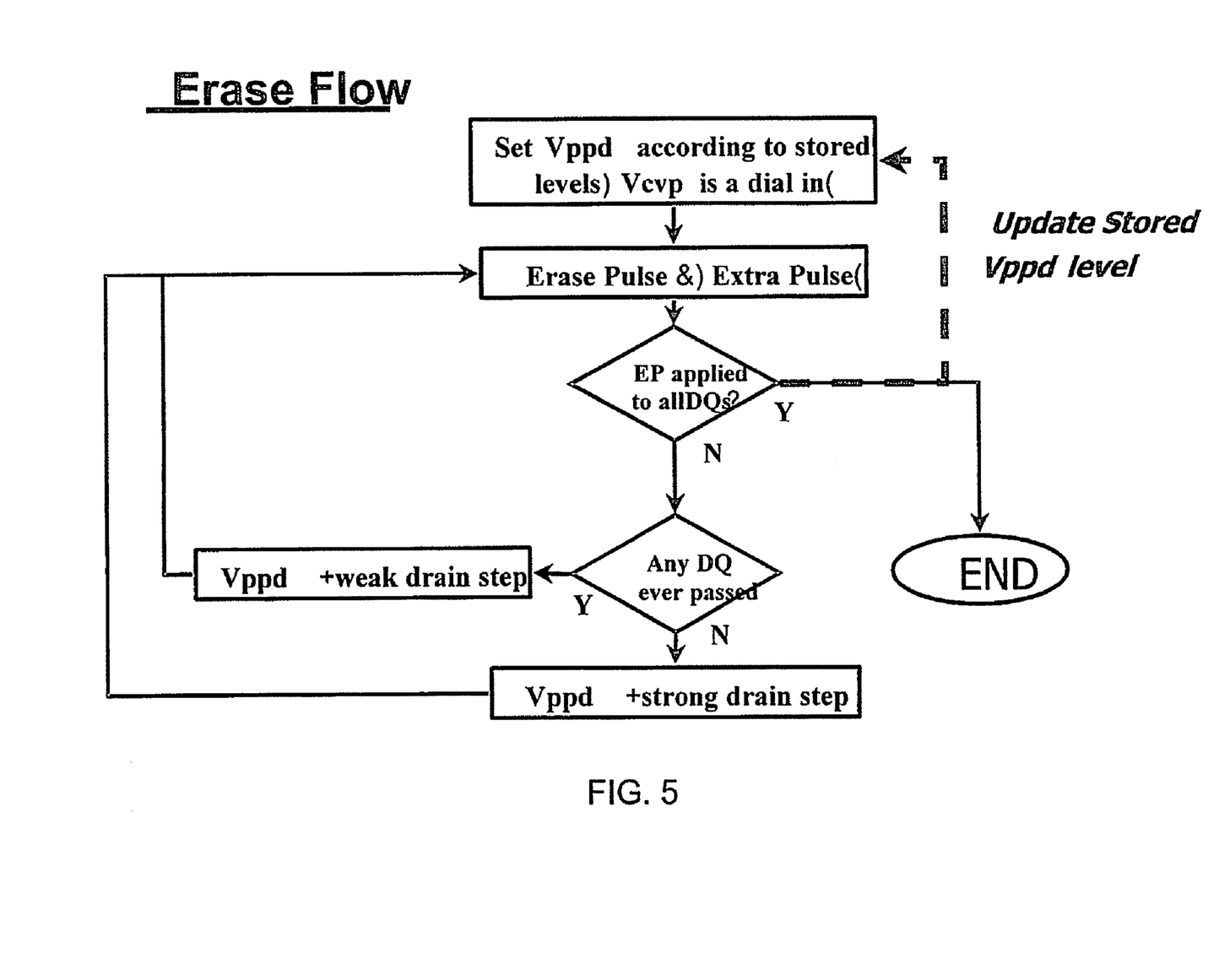
FIG. 5 shows a flow diagram including the steps of an exemplary method according to the present invention, wherein the steps of the exemplary method are shown with and in contrast to the steps of a prior art method.

Turning now to FIG. 5, there is shown a flow diagram including the steps of an exemplary method according to the present invention, wherein the steps of the exemplary method are shown with and in contrast to the steps of a prior art method. According to the exemplary algorithm shown in FIG. 5, gate (Vcvp) and drain (Vppd) voltages associated with an erase pulse to be applied to an array segment are initially set (e.g. during sorting). After an erase pulse is administered to one or more cells of the array segment (e.g. the cell ensemble), a verify operation is performed on those cell. If no subgroup (marked DQ) has fully passed erase verification a "strong" increment is administered to the drain voltage, otherwise a "weak" increment is used. This loop continuous until all cells have been verified as being erased. Each subgroup may receive an extra erase pulse (one step higher than the pulse which was required to achieve full erasure) for reliability reasons. As part of the exemplary embodiment of the present invention, the highest drain voltage (Vppd) applied in the previous erase operation may be stored and use as the initial drain voltage of the next erase operation (of the same cell ensemble).

The erase voltages employed in the previous erase operation need to be stored in dedicated cells from which they are retrieved in the following erase operation.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method of erasing one or more non-volatile memory ("NVM") cells in an NVM array segment, said method comprising: applying to an NVM cells an erase pulse whose characteristic is at least partially based upon an updateable erase pulse parameter associated with the given array segment; and
    wherein the updateable erase pulse parameter is substantially correlated to an erase pulse voltage at which a relatively slow erasing NVM cell in the array segment was induced to reach a threshold voltage associated with an erase state during a previous erase operation.

2. A method of erasing one or more non-volatile memory ("NVM") cells in an NVM array segment, said method comprising: applying to an NVM cell an erase pulse whose characteristic is at least partially based upon an updateable erase pulse parameter associated with the given array segment; and
    wherein the updateable erase pulse parameter is substantially correlated with a voltage which is offset from and lower than an erase pulse voltage at which a relatively slow erasing NVM cell in the array segment was induced to reach a threshold voltage associated with an erase state during a previous erase operation.

3. A circuit for erasing a non-volatile memory ("NVM") cell comprising: an erase pulse source to produce an erase pulse whose characteristic is based upon an updateable erase parameter associated with the given array segment; and
    wherein the updateable erase pulse parameter is substantially correlated with an erase pulse voltage at which a relatively slow erasing NVM cell in the array segment was induced to reach a threshold voltage associated with an erase state during a previous erase operation.

4. The circuit according to claim 3, wherein the updateable erase pulse parameter is substantially correlated with a voltage which is offset from and lower than an erase pulse voltage at which a relatively slow erasing NVM cell in the array segment was induced to reach a threshold voltage associated with an erase state during a previous erase operation.

5. A data storage system comprising: a non-volatile memory ("NVM") cell array and a circuit adapted to produce an erase pulse source to produce an erase pulse whose characteristic is based upon an updateable erase parameter associated with the given array segment; and
    wherein the updateable erase pulse parameter is substantially correlated with an erase pulse voltage at which a relatively slow erasing NVM cell in the array segment was induced to reach a threshold voltage associated with an erase state during a previous erase operation.

6. The data storage system according to claim 5, wherein the updateable erase pulse parameter is substantially correlated with a voltage which is offset from and lower than an erase pulse voltage at which a relatively slow erasing NVM cell in the array segment was induced to reach a threshold voltage associated with an erase state during a previous erase operation.

7. A method of fabricating a non-volatile memory ("NVM") cell array, said method comprising the steps of:
    fabricating a non-volatile memory ("NVM") cell array;
    fabricating a circuit adapted for erasing a non-volatile memory ("NVM") cell comprising: an erase pulse source to produce an erase pulse whose characteristic is based upon an updateable erase parameter associated with the given array segment; and
    wherein the updateable erase pulse parameter is substantially correlated with an erase pulse voltage at which a relatively slow erasing NVM cell in the array segment was induced to reach a threshold voltage associated with an erase state during a previous erase operation.

8. The method according to claim 6, wherein the updateable erase pulse parameter is substantially correlated with a voltage which is offset from and lower than an erase pulse voltage at which a relatively slow erasing NVM cell in the array segment was induced to reach a threshold voltage associated with an erase state during a previous erase operation.

* * * * *